US009991295B2

United States Patent
Long et al.

(10) Patent No.: US 9,991,295 B2
(45) Date of Patent: Jun. 5, 2018

(54) ARRAY SUBSTRATE MANUFACTURED BY REDUCED TIMES OF PATTERNING PROCESSES MANUFACTURING METHOD THEREOF AND DISPLAY APPARATUS

(71) Applicant: BOE Technology Group Co., Ltd., Beijing (CN)

(72) Inventors: Chunping Long, Beijing (CN); Zuqiang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 103 days.

(21) Appl. No.: 14/772,677

(22) PCT Filed: Nov. 21, 2014

(86) PCT No.: PCT/CN2014/091875
§ 371 (c)(1),
(2) Date: Sep. 3, 2015

(87) PCT Pub. No.: WO2016/023294
PCT Pub. Date: Feb. 18, 2016

(65) Prior Publication Data
US 2016/0268320 A1    Sep. 15, 2016

(30) Foreign Application Priority Data
Aug. 15, 2014  (CN) .......................... 2014 1 0400960

(51) Int. Cl.
*H01L 21/00* (2006.01)
*H01L 27/12* (2006.01)
(Continued)

(52) U.S. Cl.
CPC ........ *H01L 27/1288* (2013.01); *H01L 27/124* (2013.01); *H01L 27/127* (2013.01);
(Continued)

(58) Field of Classification Search
CPC . H01L 27/1288; H01L 27/124; H01L 27/127; H01L 28/60; H01L 29/401;
(Continued)

(56) References Cited

U.S. PATENT DOCUMENTS

2004/0263757 A1   12/2004   Kwon
2006/0145154 A1    7/2006   Choi et al.
(Continued)

FOREIGN PATENT DOCUMENTS

CN    1797161 A    7/2006
CN  102096251 A    6/2011
(Continued)

OTHER PUBLICATIONS

Jun. 5, 2017—(CN) Third Office Action Appn 201410400960.7 with English Tran.
(Continued)

*Primary Examiner* — Anthony Ho
*Assistant Examiner* — Mohammad M Hoque
(74) *Attorney, Agent, or Firm* — Banner & Witcoff, Ltd.

(57) ABSTRACT

An array substrate, a manufacturing method thereof and a display apparatus are provided. The array substrate includes thin-film transistors (TFTs) and conductive electrodes; the TFT includes a gate electrode, a source electrode, a drain electrode and an active layer; the source electrode and the drain electrode are arranged in the same layer and at two ends of the active layer and at least directly partially contact the upper surface or the lower surface of the active layer; and the conductive electrode is directly disposed on the electrode. With improved layer structures of the array substrate, a plurality of layer structures is formed in one patterning process by stepped photoresist process, so as to reduce the frequency of patterning processes, better ensure the com-
(Continued)

pactness of the array substrate, and guarantee good contact between the layer structures in the array substrate.

11 Claims, 5 Drawing Sheets

(51) Int. Cl.
    *H01L 49/02*     (2006.01)
    *H01L 29/40*     (2006.01)
    *H01L 29/45*     (2006.01)
    *H01L 29/49*     (2006.01)
    *H01L 29/786*     (2006.01)
    *H01L 51/52*     (2006.01)
    *H01L 21/02*     (2006.01)
    *H01L 27/32*     (2006.01)

(52) U.S. Cl.
    CPC ............ *H01L 28/60* (2013.01); *H01L 29/401* (2013.01); *H01L 29/458* (2013.01); *H01L 29/4908* (2013.01); *H01L 29/78672* (2013.01); *H01L 51/5215* (2013.01); *H01L 21/0217* (2013.01); *H01L 21/02043* (2013.01); *H01L 21/02164* (2013.01); *H01L 21/02274* (2013.01); *H01L 27/3244* (2013.01); *H01L 2227/323* (2013.01)

(58) Field of Classification Search
    CPC ............... H01L 29/458; H01L 29/4908; H01L 29/78672; H01L 51/5215; H01L 27/3244; H01L 21/02164; H01L 21/0217; H01L 21/02043; H01L 2227/323; H01L 21/02274
    USPC ..... 257/72; 438/48, 128, 149, 151, 157, 283
    See application file for complete search history.

(56) References Cited

U.S. PATENT DOCUMENTS

| | | | |
|---|---|---|---|
| 2007/0152220 A1* | 7/2007 | Kwack | G02F 1/1362 257/59 |
| 2008/0135851 A1* | 6/2008 | Kim | G02F 1/13318 257/72 |
| 2009/0111248 A1* | 4/2009 | Ohnuma | H01L 21/76254 438/480 |
| 2009/0201455 A1 | 8/2009 | Mural | |
| 2011/0127532 A1* | 6/2011 | Ahn | H01L 27/1288 257/59 |
| 2012/0184060 A1* | 7/2012 | Song | H01L 27/1214 438/34 |
| 2012/0193624 A1* | 8/2012 | You | H01L 27/124 257/57 |
| 2013/0037817 A1 | 2/2013 | Lee et al. | |
| 2013/0119373 A1* | 5/2013 | Yamazaki | H01L 29/7869 257/43 |
| 2014/0145179 A1* | 5/2014 | Yoon | H01L 29/66969 257/43 |
| 2014/0307194 A1* | 10/2014 | Suzumura | H01L 29/78693 349/43 |
| 2015/0077691 A1* | 3/2015 | Peng | G02F 1/134363 349/138 |

FOREIGN PATENT DOCUMENTS

| | | |
|---|---|---|
| CN | 102236228 A | 11/2011 |
| CN | 102468306 A | 5/2012 |
| CN | 102881688 A | 1/2013 |
| CN | 103137558 A | 6/2013 |
| CN | 103456746 A | 12/2013 |

OTHER PUBLICATIONS

Jan. 5, 2017—(CN) Second Office Action Appn 201410400960.7 with English Tran.

May 15, 2015—International Search Report and Written Opinion Appn PCT/CN2014/091875 with English Tran.

Jul. 18, 2016—(CN)—First Office Action Appn 201410400960.7 with English Tran.

* cited by examiner

ARRAY SUBSTRATE MANUFACTURED BY REDUCED TIMES OF PATTERNING PROCESSES MANUFACTURING METHOD THEREOF AND DISPLAY APPARATUS

The application is a U.S. National Phase Entry of International Application No. PCT/CN2014/091875 filed on Nov. 21, 2014, designating the United States of America and claiming priority to Chinese Patent Application No. 201410400960.7, filed on Aug. 15, 2014. The present application claims priority to and the benefit of the above-identified applications and the above-identified applications are incorporated by reference herein in their entirety.

TECHNICAL FIELD

At least one embodiment of the present invention relates to an array substrate, a manufacturing method thereof and a display apparatus.

BACKGROUND

Compared with a liquid crystal display (LCD), an organic light-emitting diode (OLED) display apparatus has the advantages of rapid response speed, light weight, flexibility, wide viewing angle, etc. Active-matrix OLEDs (AMO-LEDs) further have the advantages of small drive current and low power consumption and are applicable for high-resolution display.

Thin-film transistors (TFTs) taken as control switches are arranged in both the LCD and the OLED display apparatus. The TFT includes amorphous silicon (a-Si) type, polycrystalline silicon (poly-Si) type, oxide semiconductor type, organic TFT type or the like. The a-Si type or the organic TFT type has small carrier mobility and a small drive current, driving a high-brightness OLED requires a high voltage, and the device also occupies a large space. A low-temperature polysilicon (LTPS) TFT has a mobility as high as 100 $cm^2/V \cdot s$; the high-current characteristic of the LTPS TFT satisfy the exact demands of an OLED well; and the service life of the OLED is prolonged due to a low operating voltage and a high-density driver architecture. Meanwhile, in order to overcome the compensating circuit relevant to gray scale and panel uniformity, a single pixel of the display apparatus tends to be provided with a plurality of TFTs. Moreover, due to the high-density local feature of LTPS, an OLED panel with high brightness and high image quality can be obtained more easily. Currently, most of the successfully commercially produced AMOLEDs adopt LTPS TFT array substrates.

SUMMARY

At least one embodiment of the present invention provides an array substrate, a manufacturing method thereof and a display apparatus. The array substrate has simple and compact structure, greatly shortens the process time, improves the process yield and reduces the process cost.

At least one embodiment of the present invention provides an array substrate, which comprises a TFT and a conductive electrode. The TFT includes a gate electrode, a source electrode, a drain electrode and an active layer. The source electrode and the drain electrode are provided in a same layer and respectively at two ends of the active layer (that is, the source electrode and the drain electrode are provided in a same layer with the source electrode being provided corresponding to one end of the active layer and the drain electrode being provided corresponding to another end of the active layer). The source electrode and the drain electrode directly contact at least a part of an upper surface or a lower surface of the active layer; and the conductive electrode is directly disposed on the drain electrode.

At least one embodiment of the present invention provides a display apparatus, which comprises the foregoing array substrate.

At least one embodiment of the present invention provides a method for manufacturing an array substrate, which comprises the step of forming a TFT and a conductive electrode. Forming of the TFT includes forming a gate electrode, a source electrode, a drain electrode and an active layer. In the method, the source electrode, the drain electrode and the conductive electrode are formed by a same one patterning process. The source electrode and the drain electrode are directly formed at two ends of the active layer, respectively (that is, the source electrode is formed directly corresponding to one end of the active layer, and the drain electrode is formed directly corresponding to another end of the active layer). The source electrode and the drain electrode directly contact at least a part of an upper surface or a lower surface of the active layer; and the conductive electrode is directly disposed on the drain electrode.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

FIGS. 3A to 3G are schematic structural views illustrating the steps in the method for manufacturing the array substrate in FIG. 2, in which:

FIG. 3A is a schematic structural view illustrating the step of forming active layers by a first patterning process;

FIG. 3B is a schematic structural view of the product obtained after a first photo-etching of photoresist in a second patterning process;

FIG. 3C is a schematic structural view illustrating the step of forming a source electrode and a drain electrode after the first etching in the second patterning process;

FIG. 3D is a schematic structural view of the product obtained after ashing the photoresist in the second patterning process;

FIG. 3E is a schematic structural view illustrating forming of the conductive electrode after a second etching in the second patterning process;

FIG. 3F is a schematic structural view illustrating forming of the gate electrode in a third patterning process; and FIG. 3G is a schematic structural view illustrating forming of a passivation layer in a fourth patterning process.

FIGS. 5A to 5G are schematic structural views illustrating the steps in the method for manufacturing the array substrate in FIG. 4, in which:

FIG. 5A is a schematic structural view illustrating forming of a gate electrode by a first patterning process;

FIG. 5B is a schematic structural view illustrating forming of an active layer by a second patterning process;

FIG. 5C is a schematic structural view of the product obtained after a first photo etching of photoresist in a third patterning process;

FIG. 5D is a schematic structural view illustrating forming of a source electrode and a drain electrode after a first etching in the third patterning process;

FIG. 5E is a schematic structural view of the product obtained after ashing photoresist in the third patterning process;

FIG. 5F is a schematic structural view illustrating forming of a conductive electrode after second etching in the third patterning process; and FIG. 5G is a schematic structural view illustrating forming of a passivation layer by a fourth patterning process.

REFERENCE NUMERALS OF THE ACCOMPANYING DRAWINGS

1. Base Substrate; 2. Buffer Layer; 4. Active Layer; 5a. Photoresist having a Large Thickness; 5b. Photoresist having a Small Thickness; 6. Gate Insulating Layer; 7. Gate Electrode; 8. Interlayer Insulating Layer; 9. Source Electrode; 9a. Source/Drain Metal Film; 10. Drain Electrode; 11. Passivation Layer; 12. Conductive Electrode; 12a. Conductive Film; 13. Pixel Define Layer (PDF); 41 and 42. Two Plates of Storage Capacitor; 71. Gate Line; 91. Data Line.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

Figure 1:
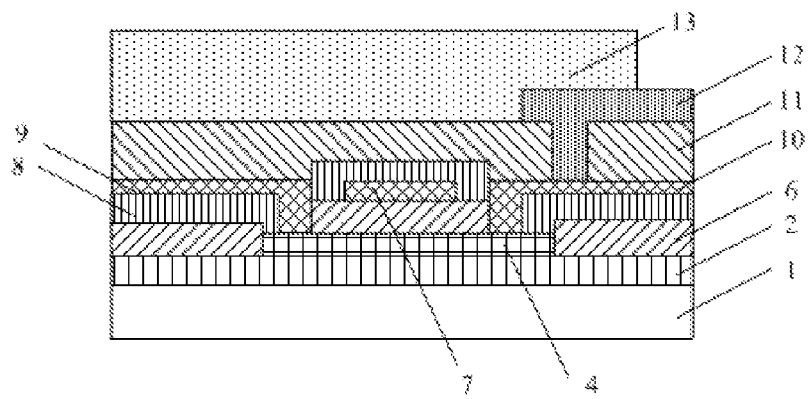
FIG. 1 is a schematic structural view of an array substrate comprising a LTPS TFT.

FIG. 1 is a schematic structural view of an LTPS TFT array substrate. The array substrate comprises layer structures such as an active layer 4, a gate electrode 7, an interlayer insulating layer 8, a source electrode 9/a drain electrode 10, a passivation layer 11, a conductive electrode 12 and a PDL 13. In the manufacturing process of the array substrate, a plurality of patterning processes is generally required, and one patterning process corresponds to one mask. The method for manufacturing the array substrate generally comprises the following steps. Description will be given below to the steps one by one.

A buffer layer 2 is formed on a base then, an a-Si film is formed on the buffer layer 2, and the a-Si is crystallized into a poly-Si; and then, a pattern comprising one plate in a storage capacitor and an active layer 4 is formed by a first patterning process (generally by a common mask). Low-concentration ion doping is performed by utilization of ion implantation process to form a semiconductor channel of a TFT in the active layer 4.

A gate insulating layer 6 is formed on the active layer 4 and the entire buffer layer 2; photoresist is formed; a photoresist pattern for forming one plate of the storage capacitor by doping a poly-Si film is formed by a second patterning process, and the photoresist pattern is taken as an ion implantation barrier layer; and the photoresist is removed after the doping process is completed.

A gate metal film is formed by depositing one or more low-resistance metallic materials on the gate insulting layer 6; and a pattern comprising a gate electrode 7 is formed by a third patterning process. The gate electrode 7 is taken as an ion implantation barrier layer for ion-doping the active layer 4.

A first dielectric film is formed on the entire surface of the gate electrode 7, and an interlayer insulating layer 8 and a source contact hole and a drain electrode contact hole in the interlayer insulating layer 8 are formed by a fourth patterning process.

A source/drain metal film is formed by depositing one or more low-resistance metallic materials; a pattern comprising a source electrode 9 and a drain electrode 10 are formed by a fifth patterning process; ohmic contact is formed between the source electrode 9 and the drain electrode 10 and the active layer 4 through the source contact hole and the drain contact hole. Ions doped in the active layer 4 are activated by rapid thermal annealing or heat treatment furnace annealing to form an effective conductive channel.

A second dielectric film is formed on the entire surface comprising the source electrode 9 and the drain electrode 10; and a passivation layer 11 including a passivation layer through hole are formed by a sixth patterning process. A hydrogenation process is performed by rapid thermal annealing or heat treatment furnace annealing to repair the defects inside and on interfaces of the active layers 4. In the step, an organic planarization layer provided with a same through hole may also be formed on the passivation layer 11 in the same one patterning process, to form a flat surface.

A transparent conductive film is formed on the array substrate obtained after the above step; a conductive electrode 12 is formed by a seventh patterning process; and when the array substrate is applied to an AMOLED, a PDL 13 as shown in FIG. 1 may be formed by an eighth patterning process.

In summary, at least seven patterning processes are required in the above method to form the array substrate comprising a LTPS TFT as shown in FIG. 1. Therefore, the process time is long; the process yield is low; and the manufacturing cost of the array substrate is high.

Embodiment 1

Figure 2:
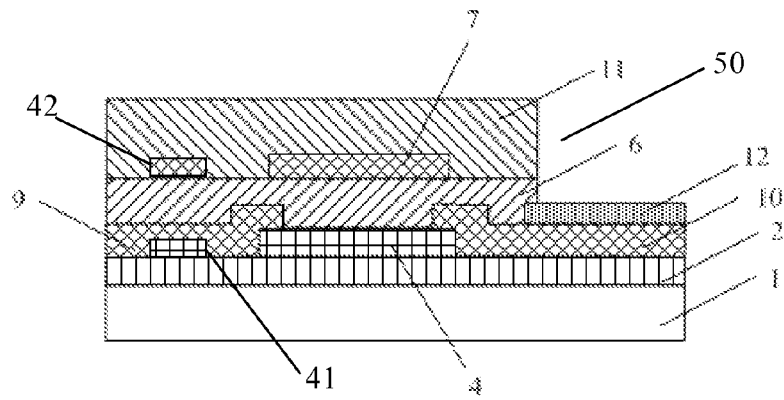
FIG. 2 is a schematic structural view of an array substrate provided by the embodiment 1 of the present invention.

This embodiment provides an array substrate, which comprises a TFT and a conductive electrode. As illustrated in FIG. 2, the TFT includes a gate electrode 7, a source electrode 9, a drain electrode 10 and an active layer 4; the source electrode 9 and the drain electrode 10 are arranged in the same layer and at two ends of the active layer 4 and directly contact at least a part of the upper surface of the active layer 4 (one side of the active layer 4 away from the base substrate 1); and the conductive electrode 12 is directly disposed on the drain electrode 10 (namely one side of the drain electrode 10 away from the base substrate 1).

The TFT as shown in FIG. 2 is a top-contact type, but the TFT in the array substrate provided by the embodiment may also be bottom-contact type, namely the source electrode 9 and the drain electrode 10 directly contact at least a part of the lower surface of the active layer 4 (namely one side of the active layer 4 facing the base substrate 1).

In at least one example, the TFT further includes a gate insulating layer 6; as for the two cases that the source electrode 9 and the drain electrode 10 are arranged on two ends of the active layer 4 and the source electrode 9 and the drain electrode 10 are arranged beneath two ends of the active layer 4, the gate insulating layer 6 may be disposed between the source electrode 9 and the drain electrode 10 and the gate electrode 7; in this situation, the gate insulating layer is disposed on the source electrode 9 and the drain electrode 10 and the gate electrode 7 is disposed on the gate insulating layer 6 (namely the gate electrode 7 is disposed on one side of the gate insulating layer 6 away from the base substrate 1); a projection of the gate electrode 7 at least partially overlaps a projection of the active layer 4; and a projection of the source electrode 9 and the drain electrode 10 at least partially overlaps the projection of the gate electrode 7. That is to say, the TFT of the array substrate in the embodiment is a top-gate type. Moreover, when the TFT is top-contact type, the layers upward from the base substrate 1 are a buffer layer 2, the active layer 4, the source electrode 9 and the drain electrode 10 provided in a same layer, the gate insulating layer 6 and the gate electrode 7. In the example, the source electrode 9 and the drain electrode 10 are provided in the same layer and directly (not requiring a source contact hole and a drain contact hole in an interlayer insulating layer 8 as shown in FIG. 1) disposed on two ends of the active layer 4 and have better contact effect.

It should be understood that: in the embodiment, "in a/the same layer" indicates that a layer for forming a specific pattern are formed by one film forming process and subsequently a layer structure is formed by one patterning process via a same one mask; according to the specific pattern, one patterning process may include a plurality of exposure, development or etching processes; the specific patterns in the formed layer structures may be continuous or discontinuous; and the specific patterns may also have different heights or thicknesses. "Projection" refers to an orthographic projection on the base substrate 1.

In order to better protect the TFT and the conductive electrode, the array substrate further comprises a passivation layer 11; the conductive electrode 12 is disposed on one end of the drain electrode 10 away from the active layer 4 (the right end of the drain electrode 10 in FIG. 2); and the passivation layer 11 at least partially covers the conductive electrode 12 and the drain electrode 10 and completely covers a region corresponding to the source electrode 9 and the active layer 4. In the top-gate array substrate provided by the embodiment, the gate insulating layer 6 is disposed on the source electrode 9 and the drain electrode 10; a region that corresponds to the passivation layer 11 and the gate insulating layer 6 and is not covered by the conductive electrode 12 forms a pixel opening; correspondingly, in an LCD device, the conductive electrode 12 is a pixel electrode; and in an OLED display apparatus, the passivation layer 11 also functions as a planarization layer and a PDL at the same time, and the conductive electrode 12 not covered by the passivation layer 11 is an anode of an OLED.

In the embodiment, the active layer 4 may be made from a LTPS material. As the active layer 4 is made from the LTPS material, the TFT has a higher mobility, so that a better current characteristic can be obtained, and hence a better performance and a longer service life of the OLED can be guaranteed.

In at least one example, the gate electrode 7, the source electrode 9 and the drain electrode 10 may be made from a same material. For instance, the gate electrode 7, the source electrode 9 and the drain electrode 10 may all be a single-layer structure formed by any one selected from the group consisting of Mo, MoNb, Al, AlNd, Ti and Cu, or may be a laminated structure obtained with sub-layers of Mo/Al/Mo or Ti/Al/Ti. For instance, the thickness of the gate electrode 7, the source electrode 9 and the drain electrode 10 may be ranged from 200 to 500 nm. Meanwhile, in at least one example, the conductive electrode 12 may be made from a transparent metal oxide; the metal oxide, for instance, includes any one selected from the group consisting of indium tin oxide (ITO), indium zinc oxide (IZO), zinc tin oxide (ZTO) and aluminum zinc oxide (AZO); and the thickness is, for instance, ranged from 20 to 100 nm. Alternatively, the conductive electrode 12 may also be a laminated layer film obtained with sub-layers of ITO/Ag/ITO or IZO/Ag; the thickness of ITO is, for instance, ranged from 10 to 50 nm; and the thickness of Ag is, for instance, ranged from 20 to 100 nm.

Correspondingly, this embodiment further provides a method for manufacturing an array substrate, which comprises the step of forming a TFT and a conductive electrode. Forming of the TFT includes the process of forming a gate electrode, a source electrode, a drain electrode and an active layer. In the method, a pattern comprising the source electrode, the drain electrode and the conductive electrode is formed by a same one patterning process; the source electrode and the drain electrode are directly formed at two ends of the active layer, respectively, and the source electrode and the drain electrode directly contact at least a part of the upper surface or the lower surface of the active layer; and the conductive electrode is directly disposed on the drain electrode.

As the TFT may be top-contact type or bottom-contact type, in the manufacturing method provided by at least one example, the active layer may be formed before the pattern comprising the source electrode, the drain electrode and the conductive electrode is formed; or the active layer may be formed after the pattern comprising the source electrode, the drain electrode and the conductive electrode is formed.

In the embodiment, in order to guarantee enough pixel charge time, the array substrate generally further comprises a storage capacitor (referred to as Cs). The storage capacitor Cs includes two plates, wherein one plate 41 is formed in the same layer with the active layer 4 and the other plate 42 is formed in the same layer with the gate electrode 7, as shown in FIG. 2. Correspondingly, the manufacturing method further comprises a step of forming a pattern of the storage capacitor Cs. No matter the pattern of the active layer 4 is formed before or after the pattern comprising the source electrode 9, the drain electrode 10 and the conductive electrode 12 is formed, one plate 41 in the storage capacitor Cs and the active layer 4 are formed by the same one patterning process.

Figure 6:
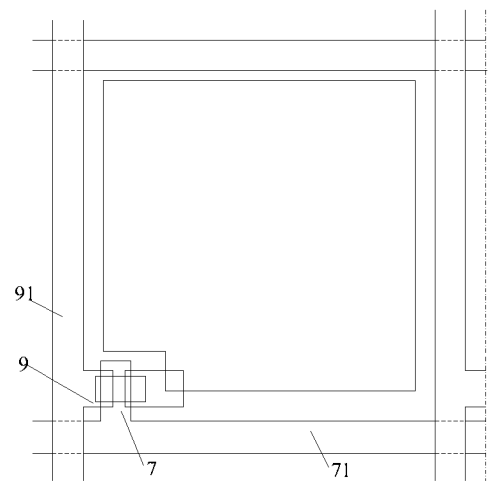
FIG. 6 is a schematic structural view illustrating the intercrossed arrangement of gate lines and data lines.

Meanwhile, for the objective of controlling the TFTs in a plurality of pixel circuits by a drive circuit, the array substrate comprises a gate line 71 and a data line 91 which are intercrossed with each other. As illustrated in FIG. 6, the gate line 71 and the gate electrode 7 are connected with each other and arranged in the same layer, and the gate line are configured for transmitting scanning signals; and the data line 91 and the source electrode 9 are connected with each other and arranged in the same layer, and the data line are configured for transmitting image display signal. Correspondingly, the method for manufacturing the array substrate further comprises the step of forming a gate line and a data line which are intercrossed with each other; the gate line is connected with the gate electrode; the data line is connected with the source electrode; the gate line and the gate electrode are arranged in the same layer and formed in the same one patterning process; and the data line and the source electrode are arranged in the same layer and formed in the same one patterning process.

Before the description of the illustrative manufacturing method, it should be understood that: in the embodiment of the present invention, the patterning process may only include photo-etching process (PEP) or includes PEP and etching step and meanwhile may further include other processes for forming a specific pattern such as printing and inkjet printing; and the PEP refers to a process including technical processes such as film forming, exposure and development and being configured for forming a pattern by utilization of photoresist, a mask, an exposure machine, etc. Corresponding patterning processes may be selected according to structures formed in the embodiment of the present invention.

Description will be given below to the method for manufacturing the array substrate, provided by the embodiment, with reference to FIGS. 3A to 3G by taking the structure of the array substrate comprising the top-contact type LTPS TFT as shown in FIG. 2 as an example. The method may comprise the following steps S1) to S4). The steps will be described below one by one. It should be noted that two plates 41 and 42 of the storage capacitor Cs are not shown in FIGS. 3A to 3G.

Step S1): forming a pattern comprising an active layer 4 and one plate in a storage capacitor Cs by a first patterning process. That is to say, a buffer layer and an a-Si film are deposited continuously on a substrate; a poly-Si film is formed by laser annealing; and a poly-Si layer and a doped poly-Si layer are formed on the substrate at the same time by one PEP. In the patterning process of the poly-Si film, a two-tone mask PEP is adopted to form stepped photoresist with two different thicknesses. Firstly, poly-Si etching process is adopted to form a poly-Si active layer and one plate in a poly-Si storage capacitor; secondly, thin photoresist is removed, and thick photoresist is retained and taken as an ion implantation barrier layer of the poly-Si active layer; and thirdly, the poly-Si storage capacitor is formed by ion implantation. Two PEPs, namely the poly-Si etching and the doping of one plate of the storage capacitor, in the method for manufacturing the array substrate as shown in FIG. 1 are integrated into one step. For instance, the step S1) may include the following steps.

Figure 3A:
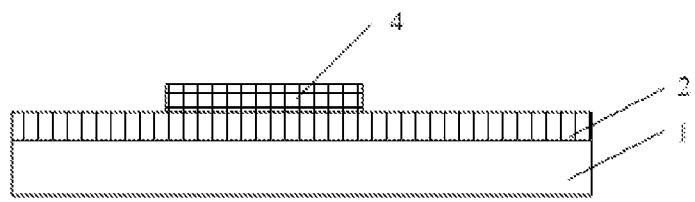

Firstly, a base substrate 1 is initially cleaned to remove foreign particles on a surface of the base substrate 1, and subsequently one layer of a silicon nitride (SiN) film and a silicon dioxide ($SiO_2$) film is deposited on the surface of the base substrate 1 by plasma enhanced chemical vapor deposition (PECVD) and taken as a buffer layer 2, as shown in FIG. 3A. As the buffer layer 2, the thickness of SiN is, for instance, ranged from 50 to 100 nm, and the thickness of $SiO_2$ is, for instance, ranged from 100 to 400 nm. The SiN film for forming the buffer layer 2 has strong diffusion barrier property and can avoid the influence of a small amount of alkali metal ions and Na and K metal ions in the base substrate (generally, a glass substrate) on the poly-Si film. The $SiO_2$ film and the poly-Si film have excellent interfaces which can prevent the defects of the SiN film from damaging the quality of the poly-Si film.

Secondly, one plate of the storage capacitor Cs and the active layer 4 are formed on the buffer layer 2. For instance, forming of one plate of the storage capacitor Cs and the active layer 4 may include the following steps S11) to S14). The steps will be described below one by one.

Step S11): forming a poly-Si film.

In the step, an a-Si film with the thickness of 40-100 nm is deposited continuously by PECVD; the a-Si film is subjected to dehydrogenation process via a heat treatment furnace, so as to prevent hydrogen decrepitation (HD) in the crystallization process; next, a-Si crystallization process is performed, and the poly-Si film may be formed by, for instance, laser annealing crystallization, metal induced crystallization, solid phase crystallization or other methods; and subsequently, the poly-Si film is cleaned by diluted hydrofluoric acid, so that the surface roughness of the poly-Si film can be reduced, and hence the defects of interfaces of the TFTs can be reduced.

Step S12): forming photoresist, and performing exposure and development on the photoresist by a two-tone mask process. In a mask adopted by the two-tone mask process, a region configured for forming one plate of the storage capacitor Cs is a partially transmissive region, and a region configured for forming the active layer 4 is a light-tight region.

In the step, one layer of photoresist is formed on a surface of the poly-Si film; the photoresist with two different thicknesses is formed on the surface of the poly-Si film via a two-tone mask; the active layer 4 is formed in a poly-Si film region corresponding to the photoresist with a large thickness; and one plate of the storage capacitor Cs is formed in a poly-Si film region corresponding to the photoresist with a small thickness. The two-tone mask may be a half-tone mask or a gray-tone mask. The thickness of the photoresist with a large thickness is, for instance, 1 to 3 micrometers, and the thickness of the photoresist with a small thickness is, for instance, 0.5 to 1 micrometers.

Step S13): removing the poly-Si film not protected by the photoresist by an etching process, and forming a pattern comprising one plate of the storage capacitor Cs and the active layer 4.

In the step, for instance, the poly-Si film is etched by plasma or inductively coupled plasma (ICP) method via a mixed gas selected from the group consisting of $CF_4/O_2$, $CHF_3/O_2$ or $SF_6/O_2$, to remove the poly-Si film not protected by the photoresist; and the pattern comprising the active layer 4 and one plate of the storage capacitor Cs (the storage capacitor Cs is not shown in both FIG. 2 and FIG. 3A) are formed.

Step S14): removing the photoresist corresponding to the partially transmissive region by an ashing process, performing ion-doping on the one plate of the storage capacitor Cs, and forming one plate of the storage capacitor Cs and the active layer 4.

In the step, the photoresist with a small thickness is removed by, for instance, a plasma ashing process; the photoresist with a large thickness is retained (at this point, the thickness of the photoresist is also reduced correspondingly, and hence photoresist with reduced thickness is formed); and the photoresist is taken as an ion implantation barrier layer. Subsequently, one plate of the storage capacitor Cs is subjected to ion doping by ion implantation or ion cloud implantation method; doped ions are generally $PH_3/H_2$ or $B_2H_6/H_2$; the ion implantation dosage may be $10^{14}$ ions/cm$^2$-$10^{16}$ ions/cm$^2$; and the implantation energy may be 10 KeV-100 KeV. After the ion implantation process is completed, residual photoresist is removed by a plasma etcher or stripper, and the active layer 4 and one plate of the storage capacitor Cs as shown in FIG. 3A are formed. The doped ion is activated by rapid thermal annealing process to increase the electric conductivity of the poly-Si film.

In the embodiment, the active layer 4 may be subjected to ion doping or not subjected to ion doping. When the active layer 4 is subjected to ion doping, the doping process is generally performed after the poly-Si film is formed; the entire poly-Si film is doped; and the barrier of the mask is not required. As the ion doping of the active layer 4 (namely the ion doping of a channel region) is low-dosage and low-concentration doping, the poly-Si film outside the region of the active layer 4 will not be affected.

Step S2): forming a pattern comprising a source electrode 9, a drain electrode 10 and a conductive electrode 12 by a second patterning process. That is to say, a source/drain metal film and a conductive film are formed continuously on the active layer 4; stepped photoresist with two different thicknesses is formed by a two-tone mask PEP; the exposed conductive film and the exposed source/drain metal film are etched continuously, to form a pattern comprising the source electrode, the data line and the drain electrode; the thin photoresist is removed; the corresponding exposed conductive film on the source electrode, the data line and the drain electrode is removed by etching; and subsequently, the photoresist is removed to form a pattern comprising the conductive electrode. The step S2), for instance, includes the following steps S21) to S24). The steps will be described below one by one.

Step S21): forming a source/drain metal film 9a, a conductive film 12a and photoresist on the active layer 4 sequentially.

In the step, firstly, the source/drain metal film 9a with a thickness of 200-500 nm is formed on the active layer 4 by, for instance, magnetron sputtering process. The source/drain metal film 9a may be a single-layer structure formed by any one selected from the group consisting of Mo, MoNb, Al, AlNd, Ti and Cu, or may be a laminated structure obtained with sub-layers of Mo/Al/Mo or Ti/Al/Ti.

Secondly, a transparent conductive film 12a is formed on the source/drain metal film 9a by, for instance, magnetron sputtering process. The conductive film 12a may be a single structure formed by metal oxide. The metal oxide includes any one selected from the group consisting of ITO, IZO, ZTO and AZO, and the thickness may be ranged from 20 to 100 nm. Alternatively, the conductive film 12a may be a laminated layer film obtained with sub-layers of ITO/Ag/ITO or IZO/Ag with the thickness of the ITO film being, for instance, ranged from 10 to 50 nm and the thickness of the Ag film being, for instance, ranged from 20 to 100 nm. When the array substrate comprising the LTPS TFTs is applied to a bottom-emission AMOLED display apparatus, the conductive film 12a is generally made from metal oxide such as ITO, IZO, ZTO, AZO or the like. When the array substrate comprising the LTPS TFTs is applied to a top-emission AMOLED display apparatus, the conductive film 12a is generally a composite film such as ITO/Ag/ITO, IZO/Ag, or the like.

Step S22): performing exposure and development on the photoresist by a two-tone mask process, in which in a mask adopted by the two-tone mask process, a region configured for forming the source electrode and the drain electrode and not covered by the conductive electrode is a partially transmissive region, and a region configured for forming the conductive electrode is a light-tight region.

Figure 3B:
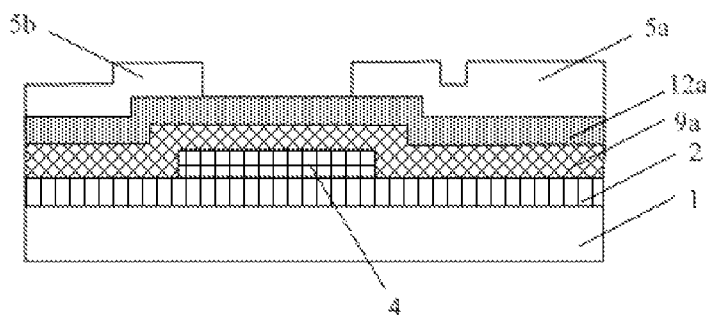

As illustrated in FIG. 3B, in the step, photoresist with two different thicknesses (photoresist 5a with a large thickness and photoresist 5B with a small thickness) is formed on a surface of the conductive film 12a via a two-tone mask; the photoresist 5a with a large thickness corresponds to a region configured for forming the conductive electrode 12; and the photoresist 5b with a small thickness corresponds to a region configured for forming the source electrode 9, the data line and the drain electrode 10. The two-tone mask may be a half-tone mask or a gray-tone mask. The thickness of the photoresist 5a with a large thickness is, for instance, 1 to 3 micrometers, and the thickness of the photoresist 5b with a small thickness is, for instance, 0.5 to 1 micrometers.

Step S23): removing the conductive film and the source/drain metal film not protected by the photoresist by an etching process, and forming a pattern comprising the source electrode and the drain electrode.

Figure 3C:
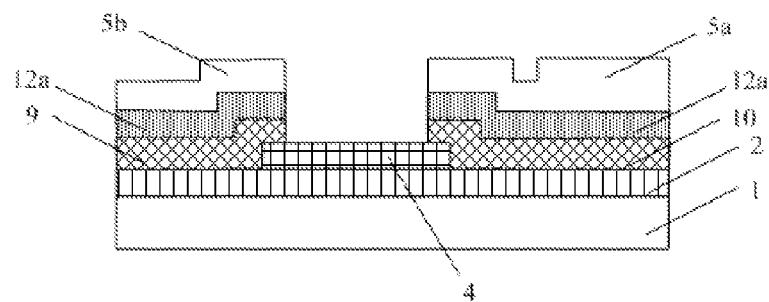

As illustrated in FIG. 3C, in the step, the conductive film 12a and the source/drain metal film 9a not protected by the photoresist are removed by an etching process, to form a pattern comprising the source electrode 9, the data line and the drain electrode 10. In the step, the etching process of the conductive film 12a generally adopts a wet etching process; the etching process for the source/drain metal film 9a may be a wet etching and may also be a dry etching process. For instance, a metal film with a laminated structure obtained with sub-layers of Mo/Al/Mo is etched and removed by a wet etching process, and a metal film with a laminated structure obtained with sub-layers of Ti/Al/Ti is etched and removed by a ICP method via mixed gas such as $CCl_2/BCl_3$ or $CF_4/O_2$. The wet etching process has the advantage of easily forming a side surface with a smooth side wall and a small slope-angle. The dry etching process has the advantage of easily forming patterns with a small critical size and at an accurately controlled size.

Step S24): removing the photoresist corresponding to the partially transmissive region by an ashing process, removing the conductive film not protected by the photoresist by an etching process, and forming a pattern comprising the conductive electrode.

Figure 3D:
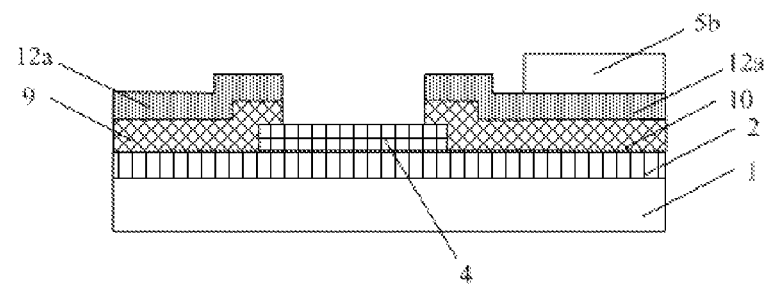
Figure 3E:
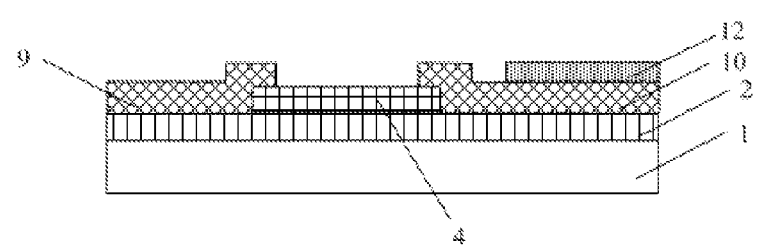

As illustrated in FIG. 3D, in the step, photoresist 5b with a small thickness is removed by, for instance, a plasma ashing process, and photoresist 5a with a large thickness is retained (at this point, the thickness of the photoresist 5a is also reduced correspondingly, and the photoresist with reduced thickness is formed and marked as 5b in FIG. 3D) and taken as a etch barrier layer. As illustrated in FIG. 3E, the region of the conductive film 12a configured for forming the source electrode 9, the data line and the drain electrode 10 and not protected by the photoresist is etched and removed; the residual photoresist 5b with a small thickness is stripped off to form a pattern comprising the conductive electrode 12.

In the step, the source/drain metal film 9a for forming the source electrode 9 and the drain electrode 10 and the conductive film 12a for forming the conductive electrode 12 are formed by continuous deposition means; and the source electrode 9, the data line, the drain electrode 10 and the conductive electrode 12 are formed simultaneously by one patterning process via a two-tone mask. The source electrode 9 and the drain electrode 10 directly contact the active layer 4, not like the array substrate as shown in FIG. 1 in which the contact requires a source contact hole or a drain contact hole in an interlayer insulating layer 8. Meanwhile, the conductive electrode 12 directly contacts the drain electrode 10, not like the array substrate as shown in FIG. 1 in which the contact requires a through hole in the passivation layer 11. Therefore, the structure of the array substrate is simplified; the compactness of the array substrate is better guaranteed; good contact of the layer structures in the array substrate is guaranteed; and the manufacturing process of the array substrate is also simplified correspondingly.

In the step, the source electrode 9 and the drain electrode 10 directly contact the poly-Si film without requiring a through hole in an insulating film. The advantage of the case is that possible poor processes of the etching process in the process of forming the through hole in the insulating film is eliminated. As the insulating film generally comprises at least one selected from the group consisting of $SiO_2$ and SiN, a part of the poly-Si film beneath the insulating film will also be etched and removed by etching gas for forming the through hole in the insulating film by plasma etching. Therefore, the thickness of the poly-Si active layer 4 can be reduced, and hence the TFT characteristic becomes poorer.

Step S3): forming a pattern comprising the gate insulating layer and the gate electrode by a third patterning process. The gate insulting layer is formed between the source and drain electrodes and the gate electrode. That is to say, the gate insulating layer is formed on the source electrode, the data line, the drain electrode and the conductive electrode; a gate metal film is deposited on the gate insulating layer; a pattern comprising the gate electrode and the gate line is formed by PEP; a projection of the gate electrode at least partially overlaps a projection of the active layer; and a projection of the source electrode and the drain electrode at least partially overlaps the projection of the gate electrode. The step S3), for instance, includes the following steps. The steps are described below in detail.

Figure 3F:
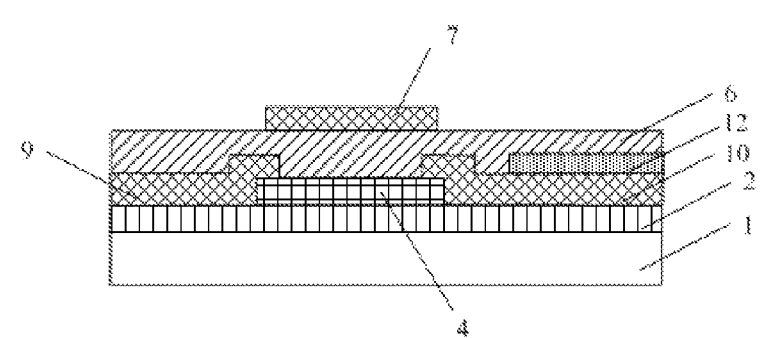

As illustrated in FIG. 3F, firstly, the gate insulating layer 6 is formed on the active layer 4, the source electrode 9, the drain electrode 10 and the conductive electrode 12 by, for instance, PECVD. The gate insulating layer 6 generally includes two films, namely a $SiO_2$ film with a thickness of 30-100 nm and a SiN film with a thickness of 20-100 nm. In the two films, the $SiO_2$ film is a bottom layer and the SiN film is a top layer.

Secondly, a gate metal film with a thickness of 200-500 nm is formed on the gate insulating layer 6 by, for instance, magnetron sputtering. The gate metal film may be a single-layer metal film such as Al, Cu, Mo, Ti and AlNd and may also be a multi-layer metal film such as Mo/Al/Mo and Ti/Al/Ti. A part of the gate metal film is removed by one patterning process to form the pattern comprising the gate electrode 7 and the gate line connected with the gate electrode 7. The etching process for the gate metal film may be a wet etching process and may also be a dry etching process, e.g., ICP etching process, as similar to the foregoing etching process for forming the source electrode 9 and the drain electrode 10 by etching the source/drain metal film 9a.

Step S4): forming a pattern comprising the passivation layer 11 by a fourth patterning process. That is to say, an inorganic insulating film is formed on the gate electrode; the passivation layer is formed by PEP, an opening of the passivation layer is taken as a pixel opening 50 to complete the manufacturing of the array substrate. The conductive electrode is formed on an end of the drain electrode away from the active layer. The passivation layer at least partially covers the conductive electrode and the drain electrode and completely covers a region corresponding to the source electrode and the active layer. For instance, the step S4) may include the following steps. The steps will be described below in detail.

Figure 3G:
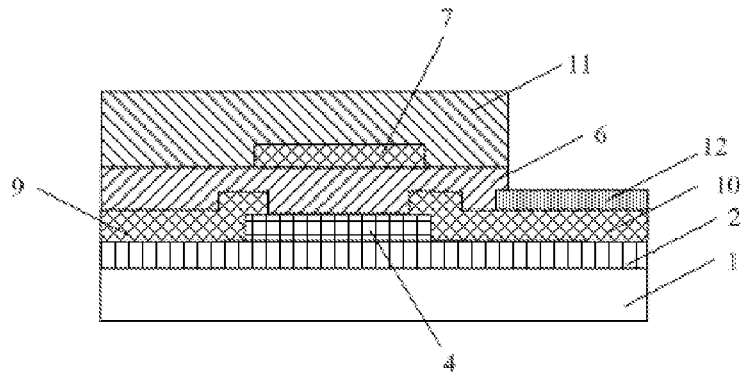

As illustrated in FIG. 3G, an inorganic insulating film is formed on the gate electrode 7 and the gate insulating layer 6 by, for instance, PECVD to form a passivation layer film. The passivation layer film is generally a hydrogen-containing SiN film with a thickness of 200-500 nm. Subsequently, the inside of the poly-Si film and the interface between the poly-Si film and the $SiO_2$ film are hydrogenated by rapid thermal annealing or heat treatment furnace annealing process by utilization of the passivation layer film and the SiN film in the gate insulating layer 6. Therefore, the body defects and the interface defects are passivated, and hence the transistor characteristic of the poly-Si film can be improved.

Subsequently, the passivation layer film is etched by, for instance, plasma or ICP method; the etching depth is to expose a top surface of the conductive electrode 12 to be an etching end; and the pattern of the passivation layer 11 is formed. The ICP method with high selectivity and good anisotropy is preferably adopted for etching. For instance, the etching of the passivation layer 11 corresponding to the conductive electrode 12 is achieved by $SF_6/O_2/He$ gas, and hence the array substrate can be manufactured.

In the array substrate provided by the embodiment, as illustrated in FIG. 3G, a part of the gate insulating layer 6 corresponding to the conductive electrode 12 may also be removed at the same time when forming the pattern of the passivation layer 11, so that a region that corresponds to the passivation layer 11 and the gate insulating layer 6 and is not covered by the conductive electrode forms a pixel opening 50. In an LCD device, the conductive electrode 12 is a pixel electrode. In an OLED display apparatus, a PDL is formed by the passivation layer 11 together with the gate insulating layer 6, and the conductive electrode 12 not covered by the passivation layer 11 and the gate insulating layer 6 is an anode of an OELD. That is to say, in an AMOLED display apparatus, the passivation layer 11 formed in the step also has the function of the PDL and can define and isolate a plurality of subpixel regions, to form a barrier layer evaporated by an AMOLED organic material. That is to say, the passivation layer 11 also functions as a passivation layer, a planarization layer and a PDL at the same time, so that the layer structures of the array substrate can be simplified, and hence the manufacturing process of the array substrate can also be simplified correspondingly.

The inorganic insulating film such as SiN is taken as the passivation layer, the planarization layer and the PDL at the same time, so that not only the structure of the array substrate can be simplified and the manufacturing processing steps can be reduced but also poor processes can be reduced. As the array substrate comprising the LTPS TFT as shown in FIG. 1 generally adopts an organic material such as acrylic and polyimide (PI) to form the planarization layer and the PDL, residual organic material tends to be produced in the process of film forming and development, and hence the surface of the gate electrode or the conductive electrode can be polluted. Therefore, a series of problems such as increased contact resistance, reduced TFT characteristic, reduced drive current and reduced luminous efficiency can be caused. And in the embodiment, as the inorganic insulating film is directly taken as the planarization layer and the PDL, the pixel opening is formed by plasma etching method and taken as a pixel region, the exposed inorganic insulating film can be completely removed without producing residue. Meanwhile, as the inorganic insulating film, the gate metal film for forming the gate electrode, and the oxide conductive film for forming the conductive electrode have high selectivity in etching, the conductive electrode will also not be over-etched.

The array substrate provided by the embodiment improves the layer structure of the top-gate type LTPS TFT array substrate, reduces the times of patterning processes (the entire array substrate is manufactured by four patterning processes), and hence improves the process yield and reduces the process cost. In the method for manufacturing the array substrate: (1) the pattern comprising the active layer and one plate of the storage capacitor is formed by one patterning process via stepped photoresist process; (2) the pattern comprising the source electrode, the data line, the drain electrode and the conductive electrode are formed by one patterning process via stepped photoresist process; the source electrode and the drain electrode directly contacts the active layer without requiring the contact hole; the conductive electrode directly contacts the drain electrode without requiring the through hole; so that the exposure times in the process of manufacturing the array substrate can be reduced, and hence the process complexity of the array substrate can be reduced, and the manufacturing process time is shortened, at the same time an improved process yield and a reduced process cost can be achieved; and (3) as the passivation layer also functions as the planarization layer and the PDL, the layer structure of the array substrate is further simplified and the manufacturing process of the array substrate is also simplified correspondingly.

The method for manufacturing the array substrate, provided by the embodiment, is particularly applicable to the manufacturing of an array substrate comprising LTPS TFT (LTPS-AMOLED) in OLED display apparatus.

Embodiment 2

Figure 4:
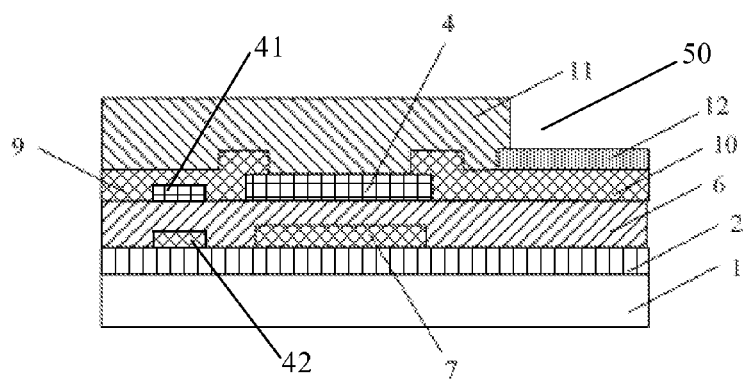
FIG. 4 is a schematic structural view of an array substrate provided by the embodiment 2 of the present invention.

The embodiment provides an array substrate, which comprises a TFT and a conductive electrode. As illustrated in FIG. 4, the TFT includes a gate electrode 7, a source electrode 9, a drain electrode 10 and an active layer 4. The source electrode 9 and the drain electrode 10 are provided in a same layer and respectively at two ends of the active layer 4, and the source electrode and the drain electrode directly contact at least a part of the upper surface of the active layer 4 (namely one side of the active layer 4 away from a base substrate 1); and a conductive electrode 12 is directly disposed on the drain electrode 10 (namely on the side of the drain electrode 10 away from the base substrate 1).

The TFT as shown in FIG. 2 is a top-emission type, but the TFT in the array substrate provided by the embodiment may also be a bottom-contact type, namely the source electrode 9 and the drain electrode 10 directly contact at least a part of the lower surface of the active layer 4 (namely the side of the active layer 4 facing the base substrate 1).

In at least one example, the TFT further includes a gate insulating layer 6; as for the two cases that the source electrode 9 and the drain electrode 10 are arranged on two ends of the active layer 4 and the source electrode 9 and the drain electrode 10 are arranged beneath two ends of the active layer 4, the gate insulating layer 6 may be disposed between the source electrode 9 and the drain electrode 10 and the gate electrode 7; in this situation, the gate insulating layer 6 is disposed on the gate electrode 7 (namely the side of the gate electrode 7 away from the base substrate 1) and the active layer 4 is disposed on the gate insulating layer 6 (namely one side of the gate insulating layer 6 away from the base substrate 1); and a projection of the gate electrode 7 at least partially overlaps a projection of the active layer 4; and a projection of the source electrode 9 and the drain electrode 10 at least partially overlaps the projection of the gate electrode 7. That is to say, the TFT of the array substrate provided by the embodiment is a bottom-gate type. Moreover, when the TFT is top-contact type, the layers upward from the base substrate 1 are a buffer layer 2, the gate electrode 7, the gate insulating layer 6, the active layer 4, and the source electrode 9 and the drain electrode 10 provided in the same layer in sequence. In the example, the source electrode 9 and the drain electrode 10 are provided in the same layer and directly (without a source contact hole and a drain contact hole in an interlayer insulating layer 8 as shown in FIG. 1) disposed on two ends of the active layer 4 and have better contact effect.

In order to better protect the TFT and the conductive electrode, the array substrate further comprises a passivation layer 11; the conductive electrode 12 is disposed on one end of the drain electrode 10 away from the active layer 4 (namely the right end of the drain electrode 10 in FIG. 4); and the passivation layer 11 at least partially covers the conductive electrode 12 and the drain electrode 10 and completely covers regions corresponding to the source electrode 9 and the active layer 4. In the bottom-gate array substrate provided by the embodiment, the gate insulating layer 6 is disposed beneath the source electrode 9 and the drain electrode 10; a region that corresponds to the passivation layer 11 and is not covered by the conductive electrode 12 forms a pixel opening 50; correspondingly, in an LCD device, the conductive electrode 12 is a pixel electrode; and in an OLED display apparatus, the passivation layer 11 also functions as a planarization layer and a PDL at the same time, and the conductive electrode 12 not covered by the passivation layer 11 is an anode of an OLED.

The materials for forming the layer structures in the array substrate provided by this embodiment are the same with the materials for forming corresponding layer structures in the embodiment 1. No further description will need to be given here.

Correspondingly, the embodiment further provides a method for manufacturing an array substrate, which comprises the step of forming a TFT and a conductive electrode. Forming of the TFT includes forming a gate electrode, a source electrode, a drain electrode and an active layer. In the method, a pattern comprising the source electrode, the drain electrode and conductive electrode are formed by the same one patterning process; the source electrode and the drain electrode are directly formed at two ends of the active layer and directly contact at least a part of the upper surface or the lower surface of the active layer; and the conductive electrode is directly disposed on the drain electrode.

As the TFT may be top-contact type or bottom-contact type, in the manufacturing method provided by at least one example, the active layer may be formed before the pattern comprising the source electrode, the drain electrode and the conductive electrode is formed; Alternatively, the active layer may be formed after the pattern comprising the source electrode, the drain electrode and the conductive electrode is formed.

In the array substrate of this embodiment, in order to guarantee enough pixel charge time, the array substrate generally further comprises a storage capacitor (referred to as Cs). The storage capacitor Cs includes two plates, wherein one plate 41 is formed in the same layer with the active layer 4 and the other plate 42 is formed in the same layer with the gate electrode 7. Correspondingly, the manufacturing method further comprises a step of forming a pattern of the storage capacitor Cs. No matter the pattern of the active layer 4 is formed before or after the pattern comprising the source electrode 9, the drain electrode 10 and the conductive electrode 12 is formed, one plate 41 in the storage capacitor Cs and the active layer 4 are formed by the same one patterning process.

Meanwhile, for the objective of controlling the TFTs in a plurality of pixel circuits by a drive circuit, the array substrate comprises a gate line 71 and a data line 91 which are intercrossed with each other. As illustrated in FIG. 6, the gate line 71 and the gate electrode 7 are connected with each other and arranged in the same layer, and the gate line are configured for transmitting scanning signals; and the data line 91 and the source electrode 9 are connected with each other and arranged in the same layer, and the data line is configured for transmitting image display signals. Correspondingly, the method for manufacturing the array substrate further comprises the step of forming a gate line and a data line which are intercrossed with each other. The gate line and the gate electrode are connected with each other, arranged in the same layer and formed in the same patterning process; and the data line and the source electrode are connected with each other, arranged in the same layer and formed in the same one patterning process.

Description will be given below to the method for manufacturing the array substrate, provided by the embodiment, with reference to FIGS. 5A to 5G by taking the structure of the array substrate comprising the top-contact type LTPS TFT as shown in FIG. 4 as an example. The method may comprise the following steps S1) to S4). The steps will be described below one by one. It should be noted that two plates 41 and 42 of the storage capacitor Cs are not shown in FIGS. 5A to 5G.

Step S1): forming a pattern comprising a gate electrode by a first patterning process. That is to say, a gate metal film is formed on a buffer layer 2, and the pattern comprising the gate electrode and the gate line is formed. For instance, the step S1) may include the following steps.

Figure 5A:
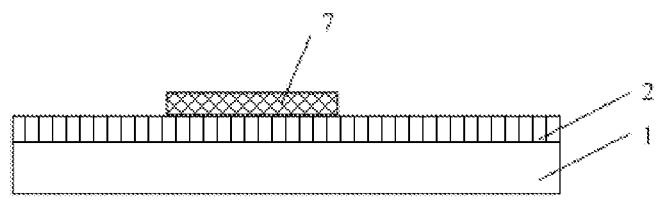

Firstly, a base substrate 1 is initially cleaned to remove foreign particles on a surface of the base substrate 1, and subsequently one layer of a SiN film and one layer of a $SiO_2$ film are deposited on the surface of the base substrate 1 by PECVD and taken as the buffer layer 2, as shown in FIG. 5A. The thickness of the SiN film taken as the buffer layer 2 may be ranged from 50 to 100 nm, and the thickness of $SiO_2$ may be ranged from 100 to 400 nm. The SiN film for forming the buffer layer 2 has a strong diffusion barrier property and can avoid the influence of a small amount of alkali metal ions and Na and K metal ions in the base substrate (generally, a glass base substrate) on the poly-Si film. The $SiO_2$ film and the poly-Si film have excellent interfaces and can prevent the defects of the SiN film from damaging the quality of the poly-Si film.

Secondly, a gate metal film with the thickness of 200-500 nm is formed on the buffer layer 2 by magnetron sputtering. The gate metal film may be a single-layer metal film such as Al, Cu, Mo, Ti, AlNd or the like, and may also be a multi-layer metal film such as Mo/Al/Mo, Ti/Al/Ti or the like. A part of the gate metal film is removed by one patterning process to form the pattern comprising the gate electrode 7 and the gate line connected with the gate electrode 7. In the step, the etching process for the gate metal film may be a wet etching process and may also be a dry etching process, e.g., ICP etching. For instance, a metal film with a laminated structure obtained with sub-layers of Mo/Al/Mo is etched and removed by wet etching process, and a metal film with a laminated structure obtained with sub-layers of Ti/Al/Ti is etched and removed by ICP method via mixed gas such as $CCl_2/BCl_3$ or $CF_4/O_2$. The wet etching process has the advantage of easily forming a side surface with a smooth side wall and a small slope-angle. The dry etching process has the advantage of easily forming patterns with small critical size and at an accurately controlled size.

Step S2): forming a pattern comprising a gate insulating layer, an active layer 4 and one plate in a storage capacitor Cs by a second patterning process. The gate insulating layer is formed between the source and drain electrodes and the gate electrode, namely the gate insulating layer is formed on the gate electrode, and the active layer is formed on the gate insulating layer. A projection of the gate electrode at least partially overlaps a projection of the active layer. A projection of the source electrode and the drain electrode at least partially overlaps the projection of the gate electrode.

That is to say, a gate insulating layer and an a-Si film are formed continuously on a gate electrode 7; a poly-Si film is formed by laser annealing; and a poly-Si layer and a doped poly-Si layer are formed at the same time by one PEP. In the patterning process of the poly-Si film, a two-tone mask PEP is adopted to form stepped photoresist with two different thicknesses. Firstly, poly-Si etching process is adopted to form a poly-Si active layer and one plate in a poly-Si storage capacitor; secondly, the thin photoresist is removed and the thick photoresist is retained and taken as an ion implantation barrier layer of the poly-Si active layer; and thirdly, one plate in the poly-Si storage capacitor is formed by ion implantation. Two PEPs, namely the poly-Si etching and the doping of one plate of the storage capacitor, in the method for manufacturing the array substrate by at least seven patterning processes are integrated into one step. For instance, the step S2) may include the following steps.

Figure 5B:
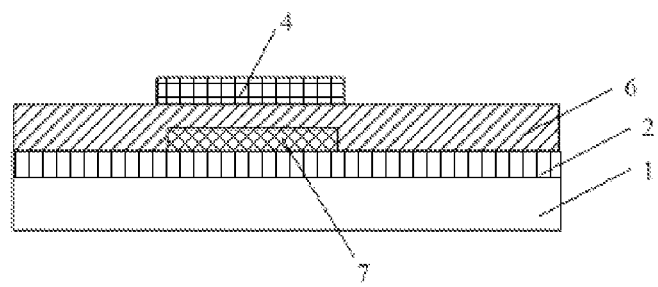

As illustrated in FIG. 5B, firstly, the gate insulating layer 6 is formed on the gate electrode 7 by PECVD. The gate insulating layer 6 may generally include two films, namely a $SiO_2$ film with a thickness of 30-100 nm and a SiN film with a thickness of 20-100 nm, in which the $SiO_2$ film is a bottom layer and the SiN film is a top layer.

Secondly, one plate of the storage capacitor Cs and the active layer 4 are formed on the gate insulating layer 6. For instance, the step of forming one plate of the storage capacitor Cs and the active layer 4 includes the following steps S21) to S24).

Step S21): forming a poly-Si film.

In the step, an a-Si film with a thickness of 40-100 nm is deposited continuously by PECVD; the a-Si film is subjected to dehydrogenation process via a heat treatment furnace, so as to prevent hydrogen decrepitation (HD) in the crystallization process; next, a-Si crystallization process is performed, and the poly-Si film may be formed by laser annealing crystallization, metal induced crystallization, solid phase crystallization or other methods; and subsequently, the poly-Si film is cleaned by diluted hydrofluoric acid, so that the surface roughness of the poly-Si film can be reduced, and hence the defects of interfaces of the TFTs can be reduced.

Step S22): forming photoresist, and performing exposure and development on the photoresist by two-tine mask process. In the step, in a mask adopted by the two-tone mask process, a region configured for forming one plate of the storage capacitor Cs is a partially transmissive region, and a region configured for forming the active layer 4 is a light-tight region.

In the step, one layer of photoresist is formed on a surface of the poly-Si film; the photoresist with two different thicknesses is formed on the surface of the poly-Si film via a two-tone mask; the active layer 4 is formed in a poly-Si film region corresponding to the photoresist with a large thickness; and one plate of the storage capacitor Cs is formed in a poly-Si film region corresponding to the photoresist with a small thickness. In the step, the two-tone mask may be a half-tone mask or a gray-tone mask. The thickness of the photoresist with a large thickness may be 1 to 3 micrometers, and the thickness of the photoresist with a small thickness may be 0.5 to 1 micrometer.

Step S23): removing the poly-Si film not protected by the photoresist by etching process, and forming a pattern comprising the active layer and one plate of the storage capacitor.

In the step, for instance, the poly-Si film is etched by plasma or ICP method a via mixed gas selected from the group consisting of $CF_4/O_2$, $CHF_3/O_2$ or $SF_6/O_2$ to remove the poly-Si film not protected by the photoresist; and the pattern comprising the active layer 4 and one plate of the storage capacitor Cs (the storage capacitor Cs is not shown in both FIG. 4 and FIG. 5B) are formed.

Step S24): removing the photoresist corresponding to the partially transmissive region by an ashing process, performing ion-doping on the one plate of the storage capacitor Cs, and forming the pattern comprising the one plate of the storage capacitor Cs and the active layer 4.

In the step, the photoresist with a small thickness is removed by plasma ashing process; the photoresist with a large thickness is retained (at this point, the thickness of the photoresist is also reduced correspondingly, and hence photoresist with reduced thickness is formed); and the photoresist is taken as an ion implantation barrier layer. Subsequently, one plate of the storage capacitor Cs is subjected to ion doping by ion implantation or ion cloud implantation method; doped ions are generally $PH_3/H_2$ or $B_2H_6/H_2$; the ion implantation dosage may be $10^{14}$ ions/cm$^2$-$10^{16}$ ions/cm$^2$; and the implantation energy may be 10 KeV-100 KeV. After the ion implantation process is completed, residual photoresist is removed by a plasma etcher or stripper, and the active layer 4 and one plate of the storage capacitor Cs as shown in FIG. 5B are formed. The doped ion is activated by rapid thermal annealing process to increase the electric conductivity of the poly-Si film.

Step S3): forming the pattern comprising a source electrode 9, a drain electrode 10 and a conductive electrode 12 by a third patterning process. The source electrode 9 and the drain electrode 10 are formed on two ends of the active layer. That is to say, a source/drain metal film and a conductive film are formed continuously on the poly-Si film; stepped photoresist with two different thicknesses is formed by a two-tone mask PEP; the exposed conductive film and the exposed source/drain metal film are etched continuously, to form a pattern comprising the source electrode, the data line and the drain electrode is formed; the thin photoresist is removed; the corresponding exposed conductive film on the source electrode, the data line and the drain electrode is removed by etching; the photoresist is removed again to form a pattern comprising the conductive electrode. For instance, the step S3) may include the following steps S31) to S34).

Step S31): forming a source/drain metal film 9a, a conductive film 12a and photoresist on the active layer 4 sequentially.

In the step, firstly, the source/drain metal film 9a with a thickness of 200-500 nm is formed on the active layers 4 by magnetron sputtering process. The source/drain metal film 9a may be a single-layer structure formed by any one selected from the group consisting of Mo, MoNb, Al, AlNd, Ti and Cu, or may be a laminated structure obtained with sub-layers of Mo/Al/Mo or Ti/Al/Ti.

Secondly, a transparent conductive film 12a is formed on the source/drain metal film 9a by magnetron sputtering process. The conductive film 12a may be a single structure formed by metal oxide. The metal oxide includes any one selected from the group consisting of ITO, IZO, ZTO and AZO, and the thickness may be ranged from 20 to 100 nm. Alternatively, the conductive film 12a may be a laminated layer film obtained with sub-layers of ITO/Ag/ITO or IZO/Ag with the thickness of the ITO film being ranged from 10 to 50 nm and the thickness of the Ag film being ranged from 20 to 100 nm. When the array substrate comprising the LTPS TFTs is applied to a bottom-emission AMOLED display apparatus, the conductive film 12a is generally made from metal oxide such as ITO, IZO, ZTO and AZO. When the array substrate comprising the LTPS TFT is applied to a top-emission AMOLED display apparatus, the conductive film 12a is generally a composite film such as ITO/Ag/ITO and IZO/Ag.

Step S32): performing exposure and development on the photoresist by a two-tone mask process, in which in a mask adopted by the two-tone mask process, a region configured for forming the source electrode and the drain electrode and not covered by the conductive electrode is a partially transmissive region, and a region configured for forming the conductive electrode is a light-tight region.

Figure 5C:
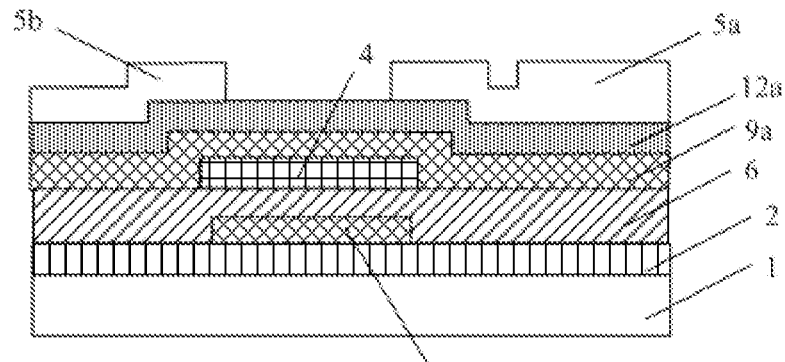

As illustrated in FIG. 5C, in the step, the photoresist with two different thicknesses (namely photoresist 5a with a large thickness and photoresist 5b with a small thickness) is formed on a surface of the conductive film 12a via a two-tone mask; the photoresist 5a with a large thickness corresponds to a region configured for forming the conductive electrode 12; and the photoresist 5b with a small thickness corresponds to a region configured for forming the source electrode 9, the data line and the drain electrode 10. The two-tone mask may be a half-tone mask or a gray-tone mask. The thickness of the photoresist 5a with a large thickness may be 1 to 3 micrometers, and the thickness of the photoresist 5b with a small thickness may be 0.5 to 1 micrometers.

Step S33): removing the conductive film and the source/drain metal film not protected by the photoresist by an etching process, and forming a pattern comprising the source electrode and the drain electrode.

Figure 5D:
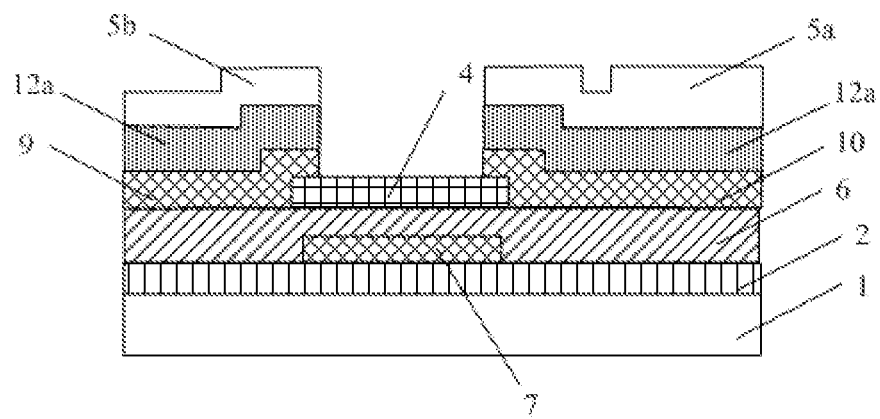

As illustrated in FIG. 5D, in the step, the conductive film 12a and the source/drain metal film 9a not protected by the photoresist are removed by an etching process, to form a pattern comprising the source electrode 9, the data line and the drain electrode 10. The etching process of the conductive film 12a generally adopts a wet etching process. The etching process for the source/drain metal film 9a may be a wet etching process and may also be a dry etching process, as similar to the foregoing etching process of forming the gate electrode 7 by etching the gate metal film.

Step S34): removing the photoresist corresponding to the partially transmissive region by an ashing process, removing the conductive film not protected by the photoresist by an etching process, and forming a pattern comprising the conductive electrode.

Figure 5E:
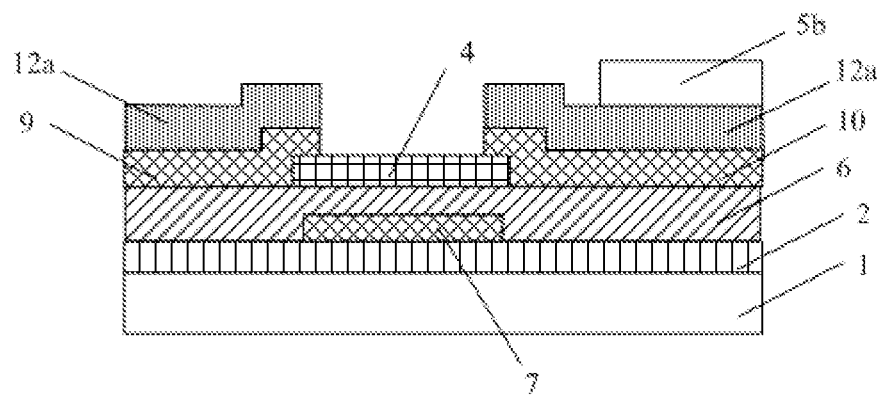
Figure 5F:
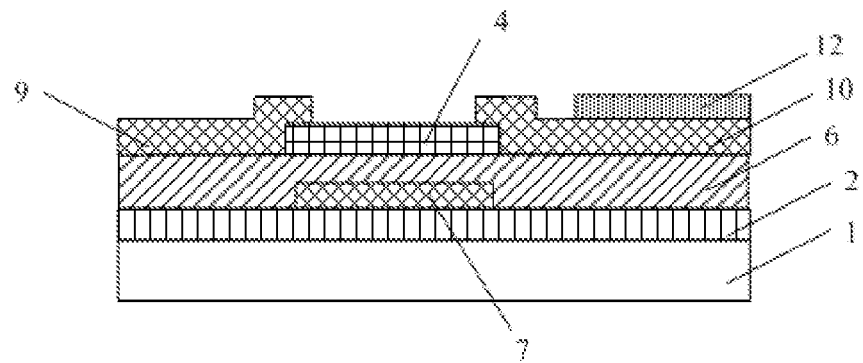

As illustrated in FIG. 5E, in the step, photoresist 5b with a small thickness is removed by a plasma ashing process, and photoresist 5a with a large thickness is retained (at this point, the thickness of the photoresist 5a is also reduced correspondingly, and the photoresist with reduced thickness is formed and marked as 5b in FIG. 5D) and taken as a etch barrier layer. As illustrated in FIG. 5F, the region of the conductive film 12a configured for forming the source electrode 9, the data line and the drain electrode 10 and not protected by the photoresist is etched and removed; the residual photoresist 5b with a small thickness is stripped off to form a pattern comprising the conductive electrode 12.

In the step, the source/drain metal film 9a for forming the source electrode 9 and the drain electrode 10 and the conductive film 12a for forming the conductive electrode 12 are formed by continuous deposition means; and the source electrode 9, the data line, the drain electrode 10 and the conductive electrode 12 are formed simultaneously by one patterning process via a two-tone mask. The source electrode 9 and the drain electrode 10 directly contact the active layer 4, not like the array substrate as shown in FIG. 1 in which the contact requires a source contact hole or a drain contact hole in an interlayer insulating layer 8. Meanwhile, the conductive electrode 12 directly contact the drain electrode 10, not like the array substrate as shown in FIG. 1 in which the contact requires a through hole in the passivation layer 11. Therefore, the structure of the array substrate is simplified; the compactness of the array substrate is better guaranteed; good contact of the layer structures in the array substrate is guaranteed; and the manufacturing process of the array substrate is also simplified correspondingly.

In the step, the source electrode 9 and the drain electrode 10 directly contact the poly-Si film without requiring a through hole in an insulating film. The advantage of the case is that possible poor processes of the etching process in the process of forming the through hole in the insulating film is eliminated. As the insulating film generally comprises at least one selected from the group consisting of $SiO_2$ and SiN, a part of the poly-Si film beneath the insulating film will also be etched and removed by etching gas for forming the through hole in the insulating film by plasma etching. Therefore, the thickness of the poly-Si active layer 4 can be reduced, and hence the TFT characteristic becomes poorer.

Step S4): forming a pattern comprising a passivation layer 11 by a fourth patterning process. That is to say, an inorganic insulating film is formed on the gate electrodes; the passivation layer is formed by PEP, an opening of the passivation layer are taken as a pixel region, to complete the manufacturing of the array substrate. In the step, the conductive electrode 12 is formed on an end of the drain electrode 10 away from the active layer 4. The passivation layer 11 at least partially covers the conductive electrode 12 and the drain electrode 10 and completely covers a region corresponding to the source electrode 9 and the active layer 4, to form pixel aperture 50. For instance, the step S4) may include the following steps.

Figure 5G:
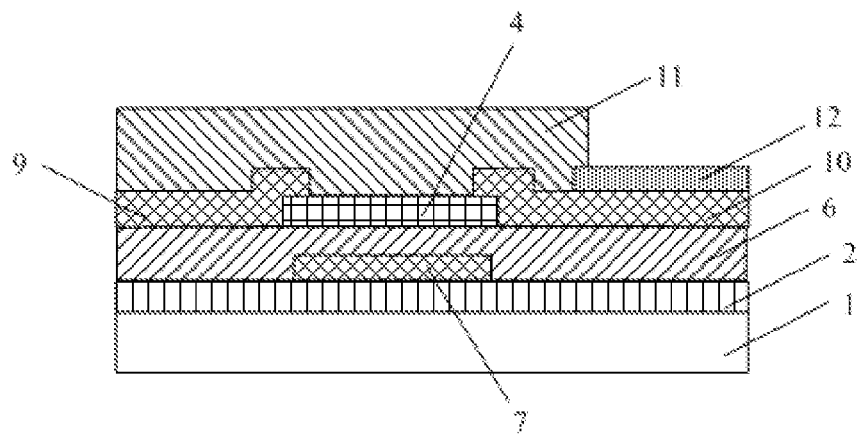

As illustrated in FIG. 5G, an inorganic insulating film is formed on the source electrode 9, the drain electrode 10 and the conductive electrode 12 by PECVD to form a passivation layer film. The passivation layer film is generally a hydrogen-containing SiN film with a thickness of 200-500 nm. Subsequently, the inside of the poly-Si film and the interface between the poly-Si film and the $SiO_2$ film are hydrogenated by rapid thermal annealing or heat treatment furnace annealing process by utilization of the passivation layer film and the SiN film in the gate insulating layer 6. Therefore, the body defects and the interface defects are passivated, and hence the transistor characteristic of the poly-Si film can be improved.

Subsequently, the passivation layer film is etched by plasma or ICP method; the etching depth is to expose a top surface of the conductive electrode 12 to be an etching end; and the pattern of the passivation layer 11 is formed. In the step, the ICP method with high selectivity and good anisotropy is preferably adopted for etching. For instance, the etching of the passivation layer 11 corresponding to the conductive electrode 12 is achieved by $SF_6/O_2/He$ gas, and hence the array substrate can be manufactured. A region of the passivation layer 11 not covered by the conductive electrode 12 forms a pixel opening 50. Correspondingly, in an LCD device, the conductive electrode 12 is a pixel electrode; and in an OLED display apparatus, the passivation layer 11 also functions as a planarization layer and a PDL at the same time, and the conductive electrode 12 not covered by the passivation layer 11 is an anode of an OLED.

In an AMOLED display apparatus, the passivation layer 11 formed in the step also functions as the PDL and can define and isolate a plurality of subpixel regions, to form a barrier layer evaporated by an AMOLED organic material. That is to say, the passivation layer 11 functions as a passivation layer, a planarization layer and a PDL at the same time, so that the layer structures of the array substrate can be simplified, and hence the manufacturing process of the array substrate can also be simplified correspondingly.

In the embodiment, the inorganic insulating film such as SiN is taken as the passivation layer, the planarization layer and the PDL at the same time, so that not only the structure of the array substrate can be simplified and the manufacturing processing steps can be reduced but also poor processes can be reduced. As the array substrate comprising the LTPS TFT as shown in FIG. 1 generally adopts an organic material such as acrylic and PI to form the planarization layer and the PDL, residual organic material tends to be produced in the process of film forming and development, and hence the surface of the gate electrode or the conductive electrode can be polluted. Therefore, a series of problems such as increased contact resistance, reduced TFT characteristic, reduced drive current and reduced luminous efficiency can be caused. And in the embodiment, as the inorganic insulating film is directly taken as the planarization layer and the PDL, the pixel opening is formed by plasma etching method and taken as a pixel region, the exposed inorganic insulating film can be completely removed without producing residue. Meanwhile, as the inorganic insulating film, the gate metal film for forming the gate electrode, and the oxide conductive film for forming the conductive electrode have high selectivity in etching, the conductive electrode will also not be over-etched.

In the array substrate provided by the embodiment, the lower surface of the active layer 4 contacts the gate insulating layer 6, and the upper surface of the active layer 4 contacts the passivation layer 11. As excessive silicon atoms are migrated to a position between crystal grains in the crystallization process from a-Si to poly-Si, the poly-Si film tends to be provided with protrusions in grain-boundary areas, and hence the roughness of the upper surface of the poly-Si film can be large. By using the bottom-gate type TFT in the embodiment, the rough upper surface of the poly-Si film contacts the inorganic insulating film of the passivation layer 11 and the smooth lower surface of the poly-Si film constitutes an interface for contacting the gate insulating layer 6, and hence the TFT has lower interface defects and better transistor characteristics.

The array substrate provided by the embodiment improves the layer structures of the bottom-gate type LTPS TFT array substrate, reduces the times of patterning processes (the entire array substrate is manufactured by four patterning processes), and hence improves the process yield and reduces the process cost. In the method for manufacturing the array substrate: (1) the pattern comprising the active layer and one plate of the storage capacitor is formed by one patterning process via stepped photoresist process; (2) the pattern comprising the source electrode, the drain electrode, the data line and the conductive electrode are formed by one patterning process via stepped photoresist process; the source electrode and the drain electrode directly contacts the active layers without requiring the contact hole; the conductive electrode directly contact the drain electrode without requiring the through hole; so that the exposure times in the process of manufacturing the array substrate can be reduced, and hence the process complexity of the array substrate can be reduced, and the manufacturing process time is shortened, at the same time an improved process yield and a reduced process cost can be achieved; and (3) as the passivation layer also functions as the PDL, the layer structure of the array substrate is further simplified, and the manufacturing process of the array substrate is also simplified correspondingly.

The method for manufacturing the array substrate, provided by the embodiment, is particularly applicable to the manufacturing of an array substrate comprising LTPS TFT (LTPS-AMOLED) in OLED display apparatus.

Embodiment 3

The embodiment provides a display apparatus, which comprises the array substrate provided by the embodiment 1 or 2.

The display apparatus may be an LCD apparatus or an OLED display apparatus according to the structure of the array substrate. That is to say, the display apparatus may be: any product or component with display function such as an LCD panel, e-paper, an OLED panel, a mobile phone, a tablet PC, a TV, a display, a notebook computer, a digital picture frame and a navigator.

When the display apparatus is an LCD device, electric fields are formed by the conductive electrode (at this point, the conductive electrode is a pixel electrode) in the embodiment 1 or 2 and a common electrode (may be disposed in a color filter (CF) substrate which is cell-assembled with the array substrate) together to control the deflection of a liquid crystal and hence achieve image display. When the display apparatus is an OLED display apparatus, the passivation layer in the embodiment 1 or 2 is also taken as a planarization layer and a PDL at the same time and configured to define a luminous region of an OLED; the conductive electrode not covered by the passivation layer is taken as an anode of the OLED; and image display is achieved under the control of a drive circuit.

The display apparatus has the advantages of low cost and high yield due to the adoption of the array substrate provided by the embodiment 1 or 2.

The foregoing is only the preferred embodiments of the present invention and not intended to limit the scope of protection of the present invention. The scope of protection of the present invention should be defined by the appended claims.

The application claims priority to the Chinese patent application No. 201410400960.7, filed on Aug. 15, 2014, the disclosure of which is incorporated herein by reference as part of the application.

What is claimed is:

1. A method for manufacturing an array substrate, comprising:

forming a thin film transistor (TFT) and a conductive electrode, in which forming of the TFT includes forming a gate electrode, a source electrode, a drain electrode and an active layer, wherein a pattern comprising the source electrode, the drain electrode and the conductive electrode is formed by a same one patterning process;

the source electrode and the drain electrode are directly formed at two ends of the active layer, respectively, and the source electrode and the drain electrode directly contact at least a part of an upper surface or a lower surface of the active layer;

the conductive electrode is directly disposed on the drain electrode, a portion, overlapping the drain electrode, of the conductive electrode entirely directly contacts the drain electrode, and the portion, overlapping the drain electrode, of the conductive electrode is outside of a positon where the drain electrode overlaps the active layer.

2. The method according to claim 1, wherein forming of the pattern comprising the source electrode, the drain electrode and the conductive electrode includes:

forming a source/drain metal film, a conductive film and a photoresist sequentially;

performing exposure and development on the photoresist by a two-tone mask process, in which in a mask adopted by the two-tone mask process, a region configured for forming the source electrode and the drain electrode and not to be covered by the conductive electrode is a partially transmissive region, a region configured for forming the conductive electrode correspondingly is a light-tight region, and a region formed outside of the above regions is a totally transmissive region;

removing the conductive film and the source/drain metal film corresponding to the totally transmissive region by an etching process, to form a pattern comprising the source electrode and the drain electrode; and removing the photoresist corresponding to the partially transmissive region by an ashing process, removing the conductive film not protected by the photoresist by an etching process, to form a pattern comprising the conductive electrode.

3. The method according to claim 2, wherein the source/drain metal film is a single-layer structure formed by any one selected from the group consisting of Mo, MoNb, Al, AlNd, Ti and Cu, or is a laminated structure obtained with sub-layers of Mo/Al/Mo or Ti/Al/Ti.

4. The method according to claim 3, wherein where the source/drain metal film is a laminated structure obtained with sub-layers of Mo/Al/Mo, a wet etching process is adopted for etching;

where the source/drain metal film is a laminated structure obtained with sub-layers of Ti/Al/Ti, an inductively coupled plasma (ICP) method is adopted for etching.

5. The method according to claim 2, wherein the conductive film is a transparent metal oxide conductive film, the metal oxide includes any one selected from the group consisting of indium tin oxide (ITO), indium zinc oxide (IZO), zinc tin oxide (ZTO) and aluminum zinc oxide (AZO); and has a thickness ranged from 20 to 100 nm; or, the conductive film is a film of laminated layers obtained with sub-layers of ITO/Ag/ITO or IZO/Ag with a thickness of a ITO film being ranged from 10 to 50 nm and a thickness of the Ag film being ranged from 20 to 100 nm.

6. The method according to claim 5, wherein the conductive film is etched by a wet etching process.

7. The method according to claim 1, further comprising:
forming a gate insulating layer between the source and drain electrodes and the gate electrodes, in which:
the gate electrode is formed on the gate insulating layer; a projection of the gate electrode at least partially overlaps with a projection of the active layer; and a projection of the source electrode and the drain electrode at least partially overlaps the projection of the gate electrode; or,
the gate insulating layer is formed on the gate electrode, the active layer is formed on the gate insulating layer; a projection of the gate electrode at least partially overlaps a projection of the active layer; and a projection of the source electrode and the drain electrode at least partially overlaps the projection of the gate electrode.

8. The method according to claim 7, further comprising:
forming a passivation layer, in which the conductive electrode is formed on an end of the drain electrode away from the active layer, the passivation layer at least partially covers the conductive electrode and the drain electrode and completely covers a region corresponding to the source electrode and the active layer;
where the gate insulating layer is disposed on the source electrode and the drain electrode, a region that corresponds to the passivation layer and the gate insulating layer and is not covered by the conductive electrode forms a pixel opening; or, where the gate insulating layer is disposed beneath the source electrode and the drain electrode, a region that corresponds to the passivation layer and is not covered by the conductive electrode forms a pixel opening.

9. The method according to claim 1, further comprising:
forming a pattern of a storage capacitor, in which
the active layer and one plate of the storage capacitor are formed by a same one patterning process.

10. The method according to claim 9, wherein forming of the active layer and the one plate in the storage capacitor includes:
forming a polysilicon film;
forming photoresist, and performing exposure and development on the photoresist by a two-tone mask process, in which in a mask adopted by the two-tone mask process, a region configured for forming the one plate in the storage capacitor is a partially transmissive region, a region configured for forming the active layer is a light-tight region, and a region formed outside of the above regions is a totally transmissive region;
removing the polysilicon film corresponding to the totally transmissive region by an etching process, to form a pattern comprising the active layer and the one plate in the storage capacitor; and
removing the photoresist corresponding to the partially transmissive region by an ashing process, performing ion doping on the one plate in the storage capacitor, to form the active layer and the one plate in the storage capacitor.

11. The method according to claim 10, wherein ions for the ion doping of the one plate in the storage capacitor are $PH_3/H_2$ or $B_2H_6/H_2$; an ion implantation dosage is $10^{14}$ ions/cm$^2$-$10^{16}$ ions/cm$^2$; and an implantation energy is 10 KeV-100 KeV.

* * * * *